(12) United States Patent
Wang et al.

(10) Patent No.: US 11,075,227 B2
(45) Date of Patent: Jul. 27, 2021

(54) DISPLAY SUBSTRATE AND METHOD OF MANUFACTURING SAME, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jun Wang, Beijing (CN); Dongfang Wang, Beijing (CN); Haitao Wang, Beijing (CN); Guangyao Li, Beijing (CN); Yingbin Hu, Beijing (CN); Yang Zhang, Beijing (CN); Qinghe Wang, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/556,779

(22) Filed: Aug. 30, 2019

(65) Prior Publication Data
US 2020/0194470 A1    Jun. 18, 2020

(30) Foreign Application Priority Data
Dec. 13, 2018 (CN) .......................... 201811524785.7

(51) Int. Cl.
*H01L 27/12*  (2006.01)
*H01L 27/02*  (2006.01)
*H01L 29/786* (2006.01)

(52) U.S. Cl.
CPC ...... *H01L 27/1244* (2013.01); *H01L 27/0292* (2013.01); *H01L 27/1259* (2013.01); *H01L 29/78633* (2013.01)

(58) Field of Classification Search
CPC ............. H01L 27/1244; H01L 27/0292; H01L 27/1259; H01L 29/78633; H01L 27/124; G02F 1/13452; G09F 9/00
See application file for complete search history.

(56) References Cited

U.S. PATENT DOCUMENTS

| | | | |
|---|---|---|---|
| 2013/0106817 A1* | 5/2013 | Gang ...................... | G02F 1/061 345/211 |
| 2016/0104757 A1 | 4/2016 | Kim et al. | |

(Continued)

FOREIGN PATENT DOCUMENTS

| | | |
|---|---|---|
| CN | 102636928 A | 8/2012 |
| CN | 104267546 A | 1/2015 |

(Continued)

OTHER PUBLICATIONS

First Office Action for Chinese Application No. 201811524785.7, dated Aug. 4, 2020, 8 Pages.

*Primary Examiner* — Victor A Mandala
(74) *Attorney, Agent, or Firm* — Brooks Kushman P.C.

(57) ABSTRACT

A display substrate, a method for manufacturing the display substrate, and a display device are provided. The display substrate includes a display area and a fanout area at the periphery of the display area. The fanout area includes a data line layer, a first power line layer, and at least two insulation layers between the data line layer and the first power line layer. In a direction perpendicular to a base substrate of the display substrate, the first power line layer overlaps the data line layer. At least one of the at least two insulation layers (Continued)

includes a portion which insulates the first power line layer and the data line layer from each other.

20 Claims, 3 Drawing Sheets

(56) References Cited

U.S. PATENT DOCUMENTS

| | | | |
|---|---|---|---|
| 2017/0047356 A1 | 2/2017 | Lee et al. | |
| 2017/0133402 A1 | 5/2017 | Ning et al. | |
| 2017/0316730 A1* | 11/2017 | Cheng | H01L 27/124 |
| 2018/0006105 A1* | 1/2018 | Kim | G09G 3/3258 |
| 2018/0033852 A1* | 2/2018 | Kwon | G02F 1/13458 |
| 2018/0069030 A1 | 3/2018 | Zhang et al. | |
| 2018/0090398 A1* | 3/2018 | Park | H01L 51/5237 |
| 2018/0337226 A1 | 11/2018 | Liu et al. | |
| 2020/0258958 A1* | 8/2020 | Gai | H01L 51/50 |
| 2020/0373377 A1* | 11/2020 | Kim | G09G 3/3258 |

FOREIGN PATENT DOCUMENTS

| | | |
|---|---|---|
| CN | 105489613 A | 4/2016 |
| CN | 108447872 A | 8/2018 |
| CN | 108493226 A | 9/2018 |

\* cited by examiner

Successively forming a first power line layer, at least two insulation layers and a data line layer in a fanout area of a display substrate — 410

DISPLAY SUBSTRATE AND METHOD OF MANUFACTURING SAME, AND DISPLAY DEVICE

CROSS-REFERENCES TO RELATED APPLICATIONS

This application claims priority to the Chinese patent application No. 201811524785.7, filed on, Dec. 13, 2018, the disclosure of which is hereby incorporated by reference in its entirety.

TECHNICAL FIELD

The present disclosure relates to the display technology field, and, in particular, to a display substrate and a method of manufacturing the display substrate, and a display device.

BACKGROUND

In the related art, a display device typically includes a display area, a driving circuit area, and a fanout area arranged between the display area and the driving circuit area for connecting display elements in the display area and a driving circuit in the driving circuit area. The fanout area is provided with a plurality of fanout lines. Exemplarily, the plurality of fanout lines includes data lines, power lines, and so on.

SUMMARY

Various embodiments of the present disclosure provide a display substrate. The display substrate includes a display area and a fanout area at a periphery of the display area.

The fanout area includes: a data line layer, a first power line layer, and at least two insulation layers between the data line layer and the first power line layer. In a direction perpendicular to a base substrate included by the display substrate, the first power line layer overlaps the data line layer. At least one of the at least two insulation layers includes a portion which insulates the first power line layer and the data line layer from each other.

In one or more embodiments of the present disclosure, the data line layer includes multiple data lines. The display substrate further includes a detection line area at a side of the fanout area away from the display area. The detection line area includes a plurality of data detection lines each extending from a respective one of the multiple data lines, extension films each extending from a respective one of the at least two insulation layers, and at least two short-circuit connection lines arranged at a side of the extension films away from the plurality of data detection lines. The plurality of data detection lines includes at least two data detection line groups. The at least two short-circuit connection lines correspond to the at least two data detection line groups respectively, and each of the at least two short-circuit connection lines is connected to data detection lines in a respective one of the at least two data detection line groups.

In one or more embodiments of the present disclosure, the at least two short-circuit connection lines and the first power line layer are arranged in a same layer and made of a same material.

In one or more embodiments of the present disclosure, the display substrate is a top-gate type display substrate, and a light shielding metal layer included by the top-gate type display substrate and the first power line layer are arranged in a same layer and made of a same material.

In one or more embodiments of the present disclosure, the at least two insulation layers include a buffer layer, a gate insulating layer and an interlayer dielectric layer which are successively arranged in a direction away from the base substrate, where the gate insulating layer is arranged between the buffer layer and the interlayer dielectric layer.

In one or more embodiments of the present disclosure, the display area includes a second power line layer, and the fanout area further includes: a connection via and a third power line. The connection via penetrates the at least two insulation layers, and an orthogonal projection of the connection via on the base substrate overlaps an orthogonal projection of the first power line layer on the base substrate. The third power line and the data line layer are arranged in a same layer and made of a same material. The third power line is connected to the second power line layer, and the third power line is connected to the first power line layer through the connection via.

In one or more embodiments of the present disclosure, the connection via is a stepped via. The stepped via includes a first sub-via and a second sub-via communicated with the first sub-via, and an aperture size of the first sub-via is greater than an aperture size of the second sub-via. The second sub-via penetrates the buffer layer, and an orthogonal projection of the second sub-via on the base substrate overlaps the orthogonal projection of the first power line layer on the base substrate. The first sub-via penetrates the gate insulating layer and the interlayer dielectric layer, and the orthogonal projection of the second sub-via on the base substrate is within an orthogonal projection of the first sub-via on the base substrate.

In one or more embodiments of the present disclosure, one connection via includes one first sub-via and a plurality of second sub-vias.

In one or more embodiments of the present disclosure, the display area includes a second power line layer, and the fanout area further includes a connection via penetrating the at least two insulation layers and a third power line. An orthogonal projection of the connection via on the base substrate overlaps an orthogonal projection of the first power line layer on the base substrate. The third power line and the data line layer are arranged in a same layer and made of a same material. The third power line is connected to the second power line layer, and the third power line is connected to the first power line layer through the connection via.

In one or more embodiments of the present disclosure, a part of the first power line layer is of a hollow structure.

Various embodiments of the present disclosure provide a display device including the any one of the display substrate above.

Various embodiments of the present disclosure provide a method of manufacturing the display substrate above. The method includes: successively forming the first power line layer, the at least two insulation layers and the data line layer in the fanout area of the display substrate.

In one or more embodiments of the present disclosure, the data line layer includes a plurality of data lines, and the method further includes: forming at least two short-circuit connection lines in a detection line area of the display substrate; forming extension films, where each of the extension films extends from a respective one of the at least two insulation layers; and forming multiple data detection lines at a side of the extension films away from the at least two short-circuit connection lines, where each of the plurality of data detection lines extends from a respective one of the multiple data lines. The plurality of data detection lines includes at least two data detection line groups. The at least two short-circuit connection lines correspond to the at least two data detection line groups respectively, and each of the at least two short-circuit connection lines is connected to data detection lines in a respective one of the at least two data detection line groups.

In one or more embodiments of the present disclosure, the forming at least two short-circuit connection lines in the detection line area of the display substrate includes forming the first power line layer and the at least two short-circuit connection lines through one patterning process.

In one or more embodiments of the present disclosure, the display substrate is a top-gate type display substrate, and the forming the first power line layer includes: forming the first power line layer and a light shielding metal layer included by the top-gate type display substrate through one patterning process.

In one or more embodiments of the present disclosure, the display substrate further includes a second power line layer and a third power line. The step of forming the at least two insulation layers includes: in a direction away from the base substrate, successively forming a buffer layer, a gate insulating layer, and an interlayer dielectric layer; and forming a connection via penetrating the buffer layer, the gate insulating layer and the interlayer dielectric layer. An orthogonal projection of the connection via on the base substrate overlaps an orthogonal projection of the first power line layer on the base substrate. The manufacturing method further includes: forming the third power line and the data line layer through one patterning process, where the third power line is connected to the second power line layer and is also connected to the first power line layer through the connection via.

In one or more embodiments of the present disclosure, the connection via is a stepped via. The stepped via includes a first sub-via and a second sub-via communicated with the first sub-via, and an aperture size of the first sub-via is greater than an aperture size of the second sub-via. The second sub-via penetrates the buffer layer, and an orthogonal projection of the second sub-via on the base substrate overlaps the orthogonal projection of the first power line layer on the base substrate. The first sub-via runs through the gate insulating layer and the interlayer dielectric layer, and the orthogonal projection of the second sub-via on the base substrate is within an orthogonal projection of the first sub-via on the base substrate.

In one or more embodiments of the present disclosure, one connection via includes one first sub-via and a plurality of second sub-vias.

BRIEF DESCRIPTION OF DRAWINGS

The drawings described herein are used for providing further understanding to this disclosure, and form a part of this disclosure. The exemplary embodiments of the present disclosure and the description thereof are for explaining the present disclosure and should not be construed to unduly limit this disclosure. In the drawings.

DETAILED DESCRIPTION

Figure 1A:
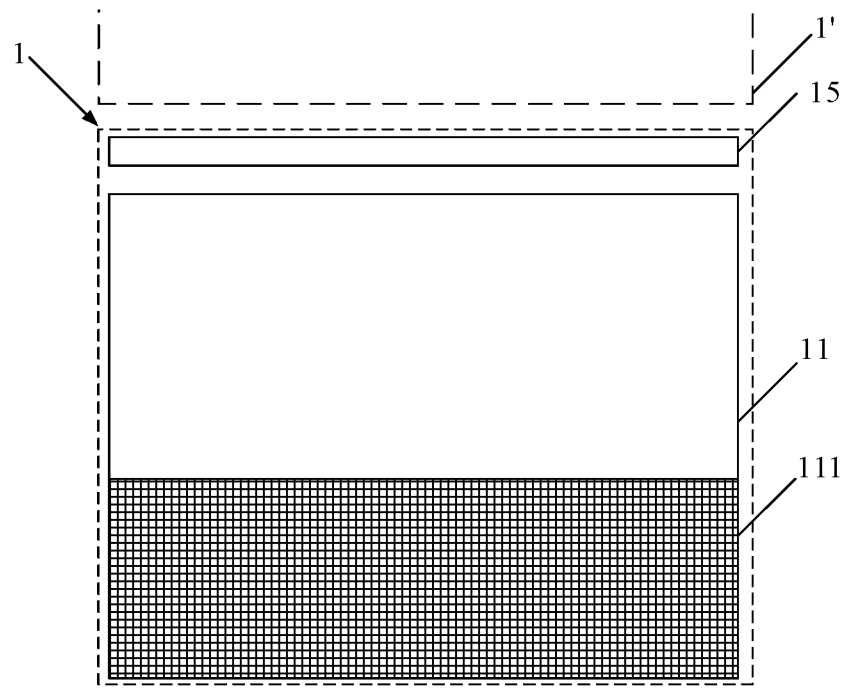
FIG. 1A is a schematic diagram of a fanout area in some steps of manufacturing a display substrate according to some embodiments of the present disclosure.

The display substrate, the method of manufacturing the display substrate and the display device provided in some embodiments of the present disclosure will be described below in conjunction with the drawings.

In the manufacturing process of the fanout area in the related art, a gate layer in a display area is used to form a power line which is in a same layer with the gate layer, a source/drain metal layer in the display area is utilized to manufacture a data line that is arranged in a same layer with the source/drain metal layer, such that the projection of power line and the projection of data line overlaps in the fanout area. Since a vertical distance between the gate layer and the source/drain metal layer is small, a vertical distance between the power line and the data line formed in the fanout area is small, which likely causes a short circuit between the power line and the data line (namely, a Data Gate Short (DGS)).

Some embodiments of the present disclosure provide a display substrate, as shown in FIG. 1A to FIG. 1C, and FIG. 2A and FIG. 2B, the display substrate includes a display area 1' and a fanout area 1 arranged at a periphery of the display area. The fanout area 1 includes a data line layer 10, a first power line layer 11, and at least two insulation layers 12 a arranged between the data line layer 10 and a first power line layer 11. The display substrate further includes a base substrate 3. In a direction perpendicular to the base substrate 3, the first power line layer 11 overlaps the data line layer 10, that is, an orthogonal projection of the first power line layer 11 on the base substrate 3 overlaps an orthogonal projection of the data line layer 10 on the base substrate 3. At least one of the at least two insulation layers 12 includes a portion which insulates the first power line layer 11 and the data line layer 10 from each other.

In some embodiments, the display substrate includes the display area, a driving circuit area, and the fanout area 1 between the display area and the driving circuit area. The fanout area 1 includes a plurality of signal line films. Exemplarily, the fanout area 1 includes the data line layer 10 and the first power line layer 11. Different types of signal line films are insulated from each other. The signal line film is configured to transmit a corresponding signal between the display area and the driving circuit area.

For example, the driving circuit area transmit corresponding signals to the display area via different types of signal line films in the fanout area 1. Exemplarily, a power signal outputted from the driving circuit area is transmitted to a second power line layer in the display area via the first power line layer 11 in the fanout area 1, and data signals outputted from the driving circuit area are transmitted to a plurality of data lines in the display area via the data line layer 10 in the fanout area 1. The display area implements the display function under the control of the signals transmitted via the fanout area 1.

According to the structure of the display substrate and the operation manner of the display substrate, the at least two insulation layers 12 included in the fanout area 1 of the display substrate provided by the above embodiments of the present disclosure include portions between the data line layer 10 and the first power line layer 11, such that the data line layer 10 and the first power line layer 11 are separated by at least two insulation layers for a distance in the direction perpendicular to the base substrate 3, where such distance is greater than the vertical distance between the power line and the data line in the related art. Therefore, such distance reduces the occurrence probability of the undesired DGS between the data line layer 10 and the first power line layer 11, and the display substrate has a more stable operation performance than the display substrate in the related art.

Figures 3, 4:
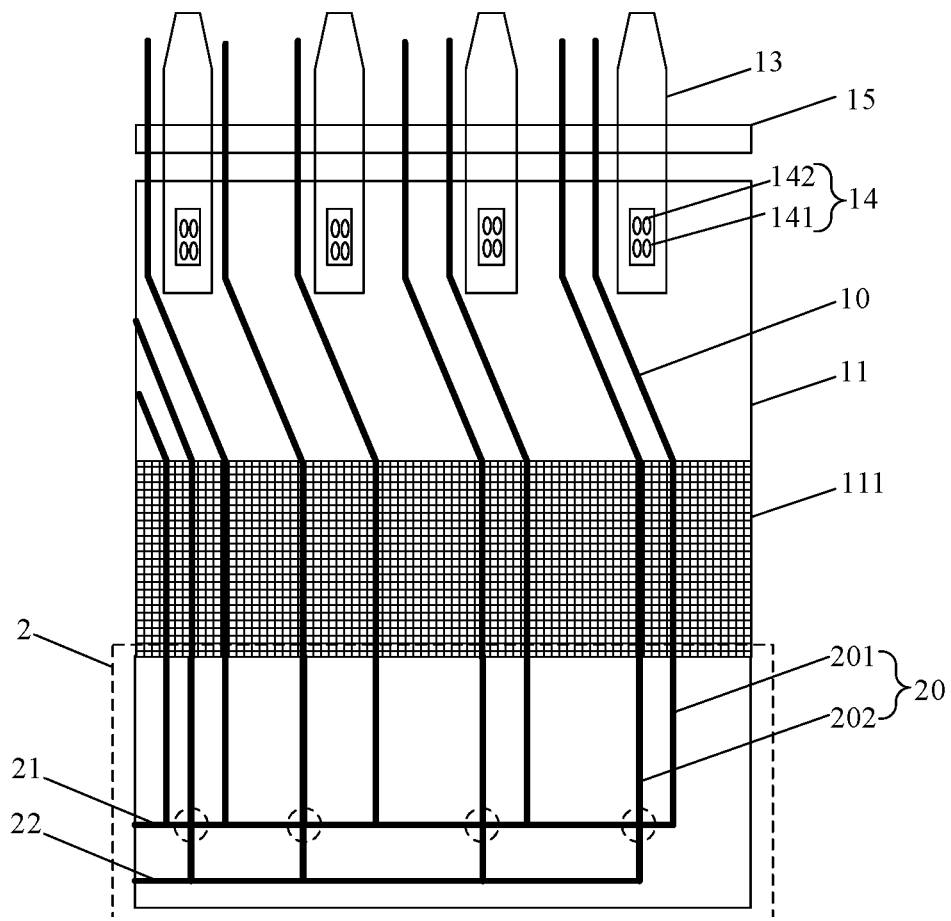
FIG. 3 is a top view of the fanout area and a text line area according to some embodiments of the present disclosure.
FIG. 4 is a flowchart of a method of manufacturing a display substrate according to some embodiments of the present disclosure.

In some embodiments, as shown in FIG. 3, the data line layer 10 provided by the above embodiments includes a plurality of data lines, and the display substrate provided in the above embodiments further includes a detection line area 2 at a side of the fanout area 1 away from the display area.

The detection line area 2 includes a plurality of data detection lines 20 each extending from a respective one of the plurality of data lines, extension films each extending from a respective one of the at least two insulation layers 12, and at least two short-circuit connection lines arranged at a side of the extension films away from the plurality of data detection lines 20. The plurality of data detection lines 20 includes at least two data detection line groups. The at least two short-circuit connection lines correspond to the at least two data detection line groups respectively, and each of the at least two short-circuit connection lines is connected to the data detection lines 20 in a respective one of the at least two data detection line groups.

For example, in the process of manufacturing the display substrate, after the display area and the fanout area 1 are fabricated, the operation performances of the display area and the fanout area 1 are detected. In the detection, detection signals are transmitted to corresponding signal lines in the display area via different types of signal line films in the fanout area 1 so as to determine whether a defect in various signal lines in the display area and the fanout area 1, e.g., open circuit or short circuit, is presented.

In order to facilitate to detect the display area and the fanout area 1, in the display substrate provided by the above embodiments, the detection line area 2 is arranged at a side of the fanout area 1 away from the display area. The detection line area 2 includes the plurality of data detection lines 20 each extending from the plurality of data lines in the fanout area 1, the extension films each extending from a respective one of the at least two insulation layers 12 in the fanout area 1, and the at least two short-circuit connection lines arranged at a side of the extension films away from the plurality of data detection lines 20. The plurality of data detection lines 20 include at least two data detection line groups. The at least two short-circuit connection lines correspond to the at least two data detection line groups respectively, and each of the at least two short-circuit connection lines is connected, through a via provided in the extension films, to the data detection lines 20 in the respective one of the at least two data detection line groups.

Exemplarily, the plurality of data detection lines 20 includes a first data detection line group and a second data detection line group. The first data detection line group includes odd-numbered data detection lines 201 of the plurality of data detection lines 20, and the second data detection line group includes even-numbered data detection lines 202 of the plurality of data detection lines 20. The at least two short-circuit connection lines include a first short-circuit connection line 21 and a second short-circuit connection line 22. The first short-circuit connection line 21 is connected to the odd-numbered data detection lines 201 in the first data detection line group, and the second short-circuit connection line 22 is connected to the even-numbered data detection lines 202 in the second data detection line group.

In the detection process, a first detection signal is transmitted to the odd-numbered data detection lines 201 through the first short-circuit connection line 21, and a second detection signal is transmitted to the even-numbered data detection lines 202 through the second short-circuit connection line 22 so as to detect the signals in the display area and the fanout area 1.

As illustrated in the above embodiments, in the direction perpendicular to the base substrate 3, projections of the even-numbered data detection lines 202 on the base substrate 3 overlaps projections of the first short-circuit connection line 21 on the base substrate 3, forming an overlapping region (as shown in the dotted circle in FIG. 3) short-circuit connection line. In the display substrate provided by the above embodiments, since the extension films extending from the at least two insulation layers 12 in the fanout area 1 are provided between the data detection lines 20 and the short-circuit connection lines, the data detection lines 20 and the short-circuit connection lines are spaced apart by a distance which is equal to a thickness of the at least two insulation layers 12 in the direction perpendicular to the base substrate 3, thereby decreasing the occurrence probability of short-circuit between the first short-circuit connection line 21 and the even-numbered data detection lines 202.

In view of the above, in the detection line area 2 of the display substrate provided in the above embodiments, the extension films with a certain thickness are provided between the plurality of data detection lines 20 and the short-circuit connection lines, so the plurality of data detection lines 20 and the short-circuit connection lines are spaced apart by a large distance, thereby decreasing the occurrence probability of short-circuit between the short-circuit connection lines and the data detection lines 20 and improving the stability of the display substrate in the detecting process.

In some embodiments of the present disclosure, the detection line area 2 of the display substrate is only used for the detecting of the display area and the fanout area 1, so the detection line area 2 is removed from the display substrate after the detecting is finished.

The positions of the at least two short-circuit connection lines in the above embodiments may be configured according to actual needs. Exemplarily, the at least two short-circuit connection lines and the first power line layer 11 in the fanout area 1 are arranged in a same layer and made of a same material.

With the configuration that the at least two short-circuit connection lines and the first power line layer 11 in the fanout area 1 are arranged in a same layer and made of a same material, the at least two short-circuit connection lines and the first power line layer 11 can be formed simultaneously through one patterning process, thereby avoiding additionally adding a procedure dedicated to forming the at least two short-circuit connection lines, simplifying the manufacturing process of the display substrate, and reducing the manufacturing cost of the display substrate.

In some embodiments of the present disclosure, the display substrate is a top-gate type display substrate, and the first power line layer 11 and a light shielding metal layer 16 included in the top-gate type display substrate are arranged in a same layer and made of a same material.

The position of the first power line layer 11 may be configured according to actual needs. For example, the above display substrate is the top-gate type display substrate, the top-gate type display substrate includes the light shielding metal layer 16 in the display area, and the light shielding metal layer 16 is closest to the base substrate 3 compared with other conductive films (e.g., a gate layer, a source layer, a drain layer, and the like) of the display substrate. Therefore, with the configuration that the first power line layer 11 and the light shielding metal layer 16 of the top-gate type display substrate are arranged in the same layer and made of the same material, the first power line layer 11 and the light shielding metal layer 16 may be formed simultaneously through one patterning process, avoiding additionally adding a procedure dedicated to forming the first power line layer 11; and the first power line layer 11 and the data line layer 10 are spaced apart by a large distance, decreasing the occurrence probability of the undesired DGS.

In some embodiments of the present disclosure, as shown in FIG. 2, the at least two insulation layers 12 between the first power line layer 11 and the data line layer 10 include a buffer layer, a gate insulating layer, and an interlayer dielectric layer, which are successively arranged in a direction away from the base substrate.

In an instance where the source layer and the drain layer which are arranged in the display area, and the data line layer 10 are arranged in a same layer and made of a same material, and the first power line layer 11 and the light shielding metal layer 16 of the top-gate type display substrate are arranged in a same layer and made of a same material, the at least two insulation layers 12 between the first power line layer 11 and the data line layer 10 include the buffer layer 121, and the gate insulating layer 122 and the interlayer dielectric layer 123, such that the distance between the first power line layer 11 and the data line layer 10 is large, which can avoid the undesired DGS phenomenon.

Figure 1B:
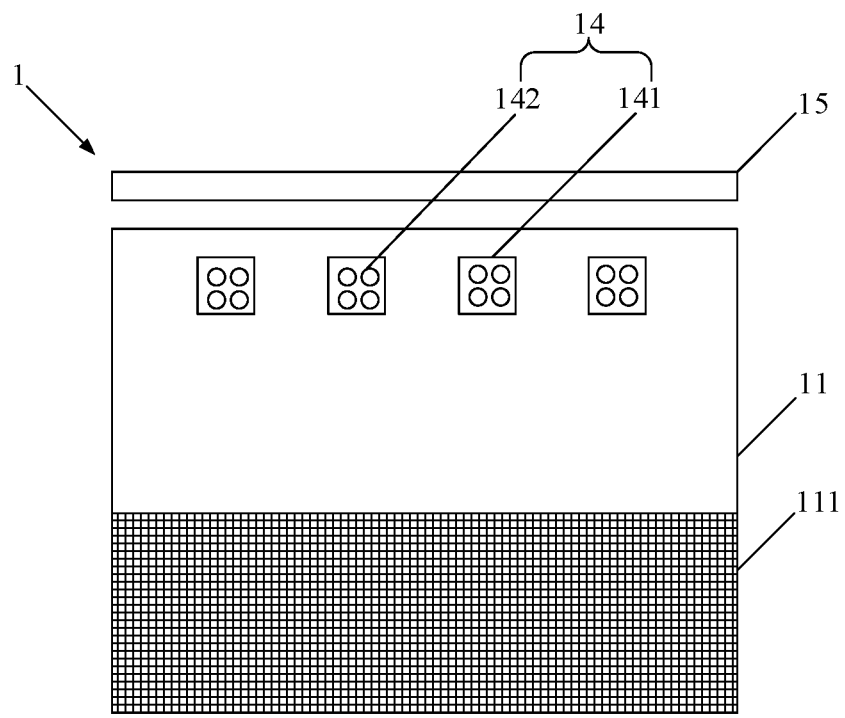
FIG. 1B is a structural diagram of the fanout area in some other steps of manufacturing the display substrate according to some embodiments of the present disclosure.
Figure 1C:
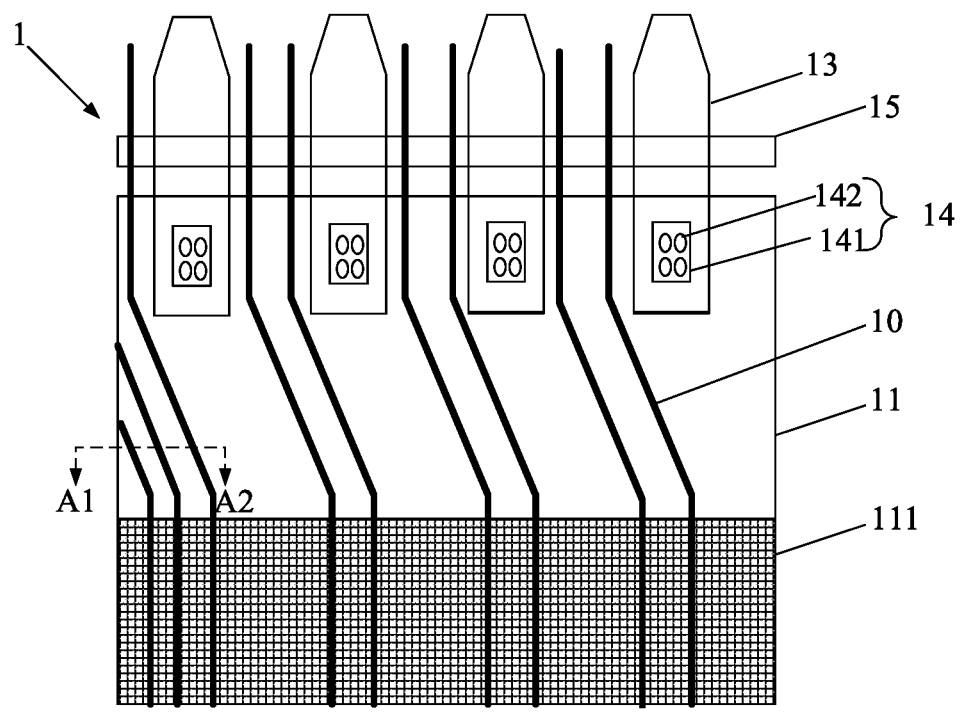
FIG. 1C is a structural diagram of the fanout area in some other steps of manufacturing the display substrate according to some embodiments of the present disclosure.
Figure 2A:
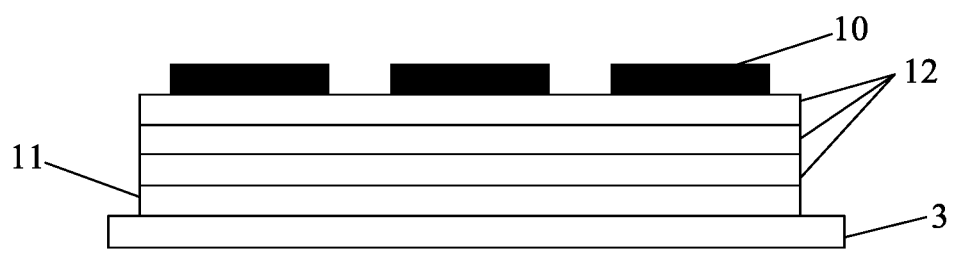
FIG. 2A is a sectional view of the display substrate along line A1A2 in the FIG. 1C.
Figure 2B:
FIG. 2B is another sectional view of the display substrate along line A1A2 in the FIG. 1C.

In some embodiments, as shown in FIG. 1C, the display area further includes a second power line layer, and the fanout area 1 further includes a connection via 14 penetrating the at least two insulation layers 12, and a third power line 13.

An orthogonal projection of the connection via 14 on the base substrate 3 overlaps an orthogonal projection of the first power line layer 11 on the base substrate 3.

The third power line 13 and the data line layer 10 are arranged in a same layer and made of a same material. The third power line 13 is connected to the second power line layer, and the third power line 13 is connected to the first power line layer 11 through the connection via 14.

The first power line layer 11 in the fanout area 1 may supply power signals to the second power line layer in the display area in various manners.

Exemplarily, the third power line 13 is arranged between the first power line layer 11 and the second power line layer, and is connected to each of the first power line layer 11 and the second power line layer, and transmits the power signal outputted by the power line layer 11 to the second power line layer.

In some embodiments, the third power line 13 and the data line layer 10 are arranged in a same layer and made from a same material.

The data line layer 10 and the third power line 13 are simultaneously formed through one patterning process, thereby avoiding an additional procedure dedicated to forming the third power line 13.

In some embodiments, the third power line 13 and the data line layer 10 are arranged in a same layer and made of a same material, the connection via 14 is provided in the at least two insulation layers 12 between the data line layer 10 and the first power line layer 11, such that the third power line 13 and the first power line layer 11 can be connected through the connection via 14.

In some embodiments, a part of the first power line layer 11 is of a hollow structure 111.

With configuring a part of the first power line layer 11 to be the hollow structure 111, an overlapping area between a projection of the first power line layer 11 on the base substrate 3 and a projection of the data line layer 10 on the base substrate 3 is decreased, thereby decreasing the occurrence probability of the undesired DGS.

In some embodiments, as shown in FIG. 1A to FIG. 1C, the display substrate further includes an Electro-Static Discharge (ESD) bus line 15 configured to discharge the static electricity of the data lines. The ESD bus line 15 is arranged in the middle of the fanout area 1. A light shielding layer included by the display substrate and the ESD bus line 15 are arranged in a same layer and made of a same material.

Some embodiments of the present disclosure further provide a display device, and the display device includes the display substrate provided in any one of the embodiments above.

In the display substrate provided in the above embodiments, the fanout area 1 includes at least two insulation layers 12, each of the at least two insulation layers 12 includes a portion between the data line layer 10 and the first power line layer 11, so the data line layer 10 and the first power line layer 11 are separated by the at least two insulation layers 12 and have a large distance in the direction perpendicular to the base substrate 3, the occurrence probability of the undesired DGS between the data line layer 10 and the first power line layer 11 is reduced, and the display substrate has a more stable operation performance. Therefore, the display device provided by any one of the embodiments of the present disclosure that includes the above display substrate also has the similar effects, which are not repeated here.

Some embodiments of the present disclosure further provide a method of manufacturing a display substrate. The method may be used for manufacturing the display substrate provided in the above embodiments. The manufacturing method includes a step 410.

In the step 410, the first power line layer 11, the at least two insulation layers 12, and the data line layer 10 are successively formed in a fanout area 1 of the display substrate. In the direction perpendicular to the base substrate 3 of the display substrate, the first power line layer 11 overlaps the data line layer 10, i.e., the orthogonal projection of the first power line layer 11 on the base substrate 3 overlaps the orthogonal projection of the data line layer 10 on the base substrate 3. Each of the at least two insulation layers 12 includes a portion between the first power line layer 11 and the data line layer 10, and the first power line layer 11 and the data line layer 10 are insulated from each other by such portions of the at least two insulation layers 12. At least one of the at least two insulation layers 12 includes a portion which insulates the first power line layer 11 and the data line layer 10 from each other.

In some embodiments of the present disclosure, in the process of forming the first power line layer 11, at least one part of the first power line layer 11 is manufactured to be a hollow structure 111 so as to reduce an overlapping area between the projection of the first power line layer 11 on the base substrate and the projection of the data line layer 10 on the base substrate 3 and reduce the occurrence probability of the undesired DGS. After the first power line layer 11 is formed, the at least two insulation layers 12 are formed at the side of the first power line layer 11 away from the base substrate 3, and the data line layer 10 is formed at the side of the at least two insulation layers 12 away from the base substrate 3.

In the display substrate manufactured by the method provided by embodiments of the present disclosure, each of the at least two insulation layers 12 in the fanout area 1 includes the portion between the data line layer 10 and the first power line layer 11, such that the data line layer 10 and the first power line layer 11 of the fanout area 1 are spaced apart by at least two insulation layers 12. Therefore, the distance between the data line layer 10 and the first power line layer 11 in the direction perpendicular to the base substrate 3 is large, the occurrence probability of the undesired DGS between the data line layer 10 and the first power line layer 11 is reduced, and the display substrate has a more stable operation performance.

In some embodiments of the present disclosure, the data line layer 10 provided by the embodiments above includes a plurality of data lines, and the method of manufacturing the display substrate provided in the above embodiments further includes the following steps.

At least two short-circuit connection lines are formed in a detection line area 2 of the di splay substrate.

Extension films, each of which extends from a respective one of the at least two insulation layers 12 are formed.

A plurality of data detection lines 20 is formed at a side of the extension films away from the at least two short-circuit connection lines, where each of the plurality of data detection lines 20 extends from a respective one of the plurality of data lines. The plurality of data detection lines 20 includes at least two data detection line groups. The at least two short-circuit connection lines correspond to the at least two data detection line groups respectively, and each of the at least two short-circuit connection lines is connected to the data detection lines 20 in the respective one of the at least two data detection line groups.

In some embodiments of the present disclosure, after the at least two short-circuit connection lines are formed, the extension films and the at least two insulation layers which are connected to each other, are formed, through one patterning process, at the side of the at least two short-circuit connection lines away from the base substrate 3. The at least two insulation layers are formed in the fanout area 1, and the extension films are formed in the detection line area 2. Then, a plurality of vias penetrating the extension films is formed, and the plurality of vias corresponds to the plurality of data detection lines 20 respectively. The data line layer 10 and the multiple data detection lines 20 are formed through one patterning process at the side of the extension films away from the base substrate 3. The plurality of data lines in the data line layer 10 is connected to the plurality of data detection lines 20 respectively. The data line layer 10 is in the fanout area 1, and the plurality of data detection lines 20 is in the detection line area 2. The plurality of data detection lines 20 includes at least two data detection line groups. The at least two short-circuit connection lines correspond to the at least two data detection line groups respectively, and each of the at least two short-circuit connection lines is connected to the data detection lines in a respective one of the at least two data detection line groups through a via.

In the method provided by the embodiments above, in the detection line area 2, thick extension films are provided between the plurality of data detection lines 20 and the short-circuit connection lines, such that the multiple data detection lines 20 and the short-circuit connection lines are separated by a large distance, the probability that short circuit occurs between the data detection lines 20 and the short-circuit connection lines is reduced, and the stability of the display substrate in the detecting process is improved.

In some embodiments of the present disclosure, the step of forming at least two short-circuit connection lines in the detection line area 2 of the display substrate includes forming the first power line layer 11 and the at least two short-circuit connection lines through one patterning process.

Since the first power line layer 11 and the at least two short-circuit connection lines are formed through one patterning process, an additional procedure dedicated to forming the at least two short-circuit connection lines is avoided, the manufacturing process of the display substrate is simplified, and the manufacturing cost of the display substrate is reduced.

In some embodiments, the display substrate is a top-gate type display substrate, and the step of forming the first power line layer 11 includes forming the first power line layer 11 and the light shielding metal layer 16 of the top-gate type display substrate through one patterning process.

In the embodiment where the display substrate is the top-gate type display substrate, the top-gate type display substrate includes a light shielding metal layer 16 in the display area, and the light shielding metal layer 16 is closest to the base substrate 3 compared with other conductive films (e.g., a gate layer, a source layer, a drain layer, and the like) of the display substrate. Therefore, with the configuration that the first power line layer 11 and the light shielding metal layer 16 of the top-gate type display substrate are formed through one patterning process, not only an additional procedure dedicated to forming the first power line layer 11 is avoided, but also the first power line layer 11 and the data line layer 10 are spaced apart by a large distance, decreasing the occurrence probability of the undesired DGS.

In some embodiments of the present disclosure, the display substrate further includes a second power line layer and a third power line 13, and the step of forming the at least two insulation layers 12 includes: in a direction away from the base substrate 3, successively forming a buffer layer 121, a gate insulating layer 122, and an interlayer dielectric layer 123; and forming a connection via 14 penetrating the buffer layer 121, the gate insulating layer 122 and the interlayer dielectric layer 123. An orthogonal projection of the connection via 14 on the base substrate 3 overlaps an orthogonal projection of the first power line layer 11 on the base substrate 3.

In some embodiments of the present disclosure, the method of manufacturing the display substrate further includes: forming the third power line 13 and the data line layer 10 through one patterning process, where the third power line 13 is connected to the second power line layer, and the third power line 13 is connected to the first power line layer 11 through the connection via 14.

In some embodiments of the present disclosure, after the buffer layer 121, the gate insulating layer 122, and the interlayer dielectric layer 123 are successively formed in the direction away from the base substrate 3, the connection via 14 penetrating the buffer layer 121, the gate insulating layer 122, and the interlayer dielectric layer 123 is formed through an etching process. Since the total thickness of the buffer layer 121, the gate insulating layer 122, and the interlayer dielectric layer 123 is large, the connection via 14 is formed as a stepped via.

In some embodiments of the present disclosure, the stepped via includes a first sub-via 141 and a second sub-via 142 communicated with each other, and an aperture size of the first sub-via 141 is greater than an aperture size of the second sub-via 142. The second sub-via 142 penetrates the buffer layer 121, and an orthogonal projection of the second sub-via 142 on the base substrate 3 overlaps the orthogonal projection of the first power line layer 11 on the base substrate 3. The first sub-via 141 penetrates the gate insulating layer 122 and the interlayer dielectric layer 123, and the orthogonal projection of the second sub-via 142 on the base substrate 3 is within an orthogonal projection of the first sub-via 141 on the base substrate 3.

In some embodiments of the present disclosure, one connection via 14 includes one first sub-via 141 and a plurality of second sub-vias 142.

In some embodiments of the present disclosure, after the connection via 14 is formed, the data line layer 10 and the third power line 13 are formed through one patterning process. An end of the third power line 13 is connected to the second power line layer, and the other end of the third power line 13 is connected to the first power line layer 11 through the connection via 14.

Through forming the data line layer 10 and the third power line 13 by one patterning process, an additional procedure dedicated to forming the third power line 13 is avoided, and the manufacturing cost is reduced. Since the at least two insulation layers 12 between the first power line layer 11 and the data line layer 10 include the buffer layer 121, the gate insulating layer 122 and the interlayer dielectric layer 123, the first power line layer 11 and the data line layer 10 are spaced apart by a large distance, which avoids the occurrence of the undesired DGS.

The method of manufacturing the display substrate is described below in detail with an embodiment of manufacturing the fanout area 1 of the top-gate type display substrate.

A material of the light shielding metal film is deposited on the provided base substrate 3 to form the light shielding metal film.

In some embodiments of the present disclosure, the material of the light shielding metal film includes Cu, Al, and Mo. Alternatively, the light shielding metal film includes two metal layers, one is made of a MoNb alloy, and the other is made of Cu. The metal layer made of the MoNb alloy is between the base substrate 3 and the metal layer made of Cu. Alternatively, the light shielding metal film includes three metal layers which are made of Mo and Al. One of the three metal layers, which is made of Al is between a first metal layer made from Mo and a second metal layer made from Mo, of the three metal layer.

In some embodiments, a thickness of the light shielding metal layer 16 ranges from 1000 Å to 9000 Å.

Photoresist is formed on the light shielding metal film. For example, a thickness of the photoresist ranges from 0.5 μm to 10 μm. Then, the photoresist is subjected to exposure, development, and a post-baking procedure successively.

In some embodiments of the present disclosure, an exposure amount ranges from 10 MJ/mm² to 500 MJ/mm², an exposure time ranged from 10 s to 500 s, a temperature of the post-baking procedure is 100° C. to 300° C., and a post-baking time is 10 s to 500 s.

In some embodiments of the present disclosure, the photoresist is exposed with a mask, and a photoresist reserving area and a photoresist removing area are formed. The photoresist reserving region corresponds to an area where the light shielding metal film and the first power line layer 11 are located, and the photoresist removing area corresponds to areas other than the area where the light shielding metal film and the first power line layer 11 are located. The exposed photoresist is developed by using developer, the photoresist in the photoresist removing area is removed, and the remaining photoresist is cured through the post-baking procedure.

A suitable etching solution is selected according to the material of the light shielding metal film, to etch the light shielding metal film in the photoresist removing area and remove the light shielding metal film in the photoresist removing area. Then, the remaining photoresist is removed, and the fabrication of the light shielding metal film and the first power line layer 11 is completed.

The buffer layer 121 is formed by depositing inorganic material. The buffer layer 121 covers the light shielding metal film and the first power line layer 11. Exemplarily, silicon oxide $SiO_x$ is selected as the inorganic material, and a thickness of the buffer layer 121 is between 1000 Å to 8000 Å.

The gate insulating layer 122 is formed by depositing inorganic material. The gate insulating layer 122 covers the buffer layer 121. Exemplarily, silicon oxide $SiO_x$ is selected as the inorganic material, and a thickness of the gate insulating layer 122 is between 1000 Å to 8000 Å.

The interlayer dielectric layer 123 is formed by depositing inorganic material. Exemplarily, the interlayer dielectric layer 123 is made of silicon oxide $SiO_x$, and a thickness of the interlayer dielectric layer 123 is between 1000 Å to 8000 Å. A photoresist layer is formed on the interlayer dielectric layer 123. For example, a thickness of the photoresist layer ranges from 0.5 μm to 10 μm. the photoresist layer is subjected to exposure, development, and a post-baking procedure successively. Exemplarily, an exposure amount ranges from 10 MJ/mm² to 500 MJ/mm², an exposure time ranges from 10 s to 500 s, a temperature of the post-baking procedure ranges from 100° C. to 300° C., and a post-baking time ranges from 10 s to 500 s.

In some embodiments of the present disclosure, the photoresist layer is exposed with a mask, and a photoresist reserving area and a photoresist removing area are formed. The photoresist removing area corresponds to an area where the first sub-via 141 of the connection via 14 is located, and the photoresist reserving area corresponds to other areas other than the area where the first sub-via 141 of the connection via 14 is located. The exposed photoresist is developed with developer, and the photoresist in the photoresist removing area is removed. Then, the remaining photoresist is cured through the post-baking procedure.

Exemplarily, the interlayer dielectric layer 123 and the gate insulating layer 122 in the photoresist removing area are etched by using a dry etching process so as to form the first sub-via 141 penetrating the interlayer dielectric layer 123 and the gate insulating layer 122, and then the photoresist in the photoresist reserving area is removed.

Then, the photoresist is formed on the interlayer dielectric layer 123 again, and the photoresist is subjected to exposure, development, and the post-baking procedure successively. Exemplarily, the exposure amount ranges from 10 MJ/mm² to 500 MJ/mm², the exposure time ranges from 10 s to 500 s, the temperature of the post-baking procedure ranges from 100° C. to 300° C., and the post-baking time ranges from 10 s to 500 s.

For example, the photoresist is exposed with a mask, and a photoresist reserving area and a photoresist removing area are formed accordingly. The photoresist removing area corresponds to an area where the second sub-via 142 of the connection via 14 is located, and the photoresist reserving area corresponds to other areas other than the area where the second sub-via 142 of the connection via 14 is located. The exposed photoresist is developed with developer, and the photoresist in the photoresist removing area is removed. Then, the remaining photoresist is cured through the post-baking procedure.

The buffer layer 121 in the photoresist removing area is etched by using a dry etching process so as to form the second sub-via 141 penetrating the buffer layer 121, and then the photoresist in the photoresist reserving area is removed, and the formation of the connection via 14 is completed.

A source/drain metal film is deposited on the interlayer dielectric layer 123 where the connection via 14 is formed.

In some embodiments of the present disclosure, the material of the source/drain metal film may be Cu, Al, or Mo. Alternatively, the source/drain metal film includes two metal layers, one of the two metal layers is made of the MoNb alloy and the other one of the two metal layers is made of Cu. The metal layer made from the MoNb alloy is between the base substrate 3 and the metal layer made of Cu. Alternatively, the source/drain metal film includes a first metal layer made from Mo, a second metal layer made from Mo, and a third metal layer made from Al. The third metal layer is between the first metal layer and the second metal layer.

Exemplarily, the source/drain metal film has a thickness ranging from 3000 Å to 9000 Å.

Then, photoresist is formed on the source/drain metal film, and the photoresist is subjected to exposure, development, and the post-baking procedure successively. For example, the exposure amount ranges from 10 $MJ/mm^2$ to 500 $MJ/mm^2$, the exposure time ranges from 10 s to 500 s, the temperature of the post-baking procedure ranges from 100° C. to 300° C., and the post-baking time ranges from 10 s to 500 s. In some embodiments, the photoresist is exposed with a mask, and a photoresist reserving area and a photoresist removing area are formed accordingly. The photoresist reserving area corresponds to areas where a source electrode and a drain electrode in the display area are located, and areas where the data line layer 10 and the third power line 13 in the fanout area 1 are located. The photoresist removing area corresponds to other areas other than the areas where the source electrode, the drain electrode, the data line layer 10 and the third power line 13 are located. The exposed photoresist is developed with developer, and the photoresist in the photoresist removing area is removed. Then, the remaining photoresist is cured through the post-baking procedure.

A suitable etching solution is selected according to the material of the source/drain metal film to etch the source/drain metal film in the photoresist removing area. Then, the remaining photoresist is removed. In this way, the source electrode, the drain electrode, the data line layer 10 and the third power line 13 are fabricated. The third power line 13 and the first power line layer 11 are connected through the connection via 14.

In some embodiments, the buffer layer 121 in the fanout area 1 of the display substrate and a buffer layer 121 in the display area of the display substrate are formed simultaneously in one procedure; the gate insulating layer 122 in the fanout area 1 of the display substrate and a gate insulating layer 122 in the display area of the display substrate are formed simultaneously in one procedure; and the interlayer dielectric layer 123 in the fanout area 1 of the display substrate and an interlayer dielectric layer 123 in the display area of the display substrate are formed simultaneously in one procedure.

Unless otherwise defined, technical or scientific terms used in the present disclosure should be understood as the ordinary meaning by a person of the ordinary skill in the art to which the disclosure pertains. The words "first," "second," and similar terms used in the present disclosure are used to distinguish different components and should not be construed as any order, quantity, or importance. The word "comprises" or "includes" or variations thereof means the element or item listed therebefore encompasses the element or item listed thereafter as well as equivalents thereof, and does not exclude other elements or items. The words "connected" or "connected to" and the like are not limited to physical or mechanical connections, but may include electrical connections, whether direct or indirect. "Upper", "lower", "left", "right", etc. are only used to indicate the relative position relationship, and when the absolute position of the object to be described is changed, the relative position relationship will be changed too.

It will be understood that in a case where an element such as a layer, a film, an area or a substrate is referred to as being "on" or "below" another element, the element may be "directly" "on" or "below" another element, or an intermediate element may be present.

In the description of the above embodiments, the features, structures, materials or characteristics may be combined in any suitable manner in any one or more embodiments or examples.

The above is merely some embodiments of the present disclosure, but the scope of the present disclosure is not limited thereto. Any modifications or alternatives easily made by those skilled in the art within the technical scope of the present disclosure shall also fall within the scope of the disclosure. Therefore, the scope of protection of the present disclosure should be determined by the scope of the claims.

What is claimed is:

1. A display substrate, comprising: a display area and a fanout area at a periphery of the display area, wherein the fanout area comprises:
   a data line layer;
   a first power line layer, wherein in a direction perpendicular to a base substrate comprised by the display substrate, the first power line layer overlaps the data line layer; and
   at least two insulation layers between the data line layer and the first power line layer, wherein at least one of the at least two insulation layers comprises a portion which insulates the first power line layer and the data line layer from each other;
   wherein the data line layer comprises a plurality of data lines;
   the display substrate further comprises a detection line area at a side of the fanout area away from the display area; and
   the detection line area comprises:
   a plurality of data detection lines each extending from a respective one of the plurality of data lines, wherein the plurality of data detection lines comprises at least two data detection line groups;

extension films each extending from a respective one of the at least two insulation layers; and
at least two short-circuit connection lines arranged at a side of the extension films away from the plurality of data detection lines, wherein the at least two short-circuit connection lines correspond to the at least two data detection line groups respectively, and each of the at least two short-circuit connection lines is connected to data detection lines in a respective one of the at least two data detection line groups.

2. The display substrate according to claim 1, wherein the at least two short-circuit connection lines and the first power line layer are arranged in a same layer and made of a same material.

3. The display substrate according to claim 1, wherein the display substrate is a top-gate type display substrate, and a light shielding metal layer comprised by the top-gate type display substrate and the first power line layer are arranged in a same layer and made of a same material.

4. The display substrate according to claim 3, wherein the at least two insulation layers comprise: a buffer layer, a gate insulating layer and an interlayer dielectric layer which are successively arranged in a direction away from the base substrate, wherein the gate insulating layer is arranged between the buffer layer and the interlayer dielectric layer.

5. The display substrate according to claim 4, wherein the display area comprises a second power line layer, and the fanout area further comprises:
a connection via penetrating the at least two insulation layers, wherein an orthogonal projection of the connection via on the base substrate overlaps an orthogonal projection of the first power line layer on the base substrate; and
a third power line, wherein the third power line and the data line layer are arranged in a same layer and made of a same material, wherein the third power line is connected to the second power line layer, and the third power line is connected to the first power line layer through the connection via.

6. The display substrate according to claim 5, wherein the connection via is a stepped via, the stepped via comprises a first sub-via and a second sub-via communicated with the first sub-via, and an aperture size of the first sub-via is greater than an aperture size of the second sub-via, wherein the second sub-via penetrates the buffer layer, and an orthogonal projection of the second sub-via on the base substrate overlaps the orthogonal projection of the first power line layer on the base substrate, wherein the first sub-via penetrates the gate insulating layer and the interlayer dielectric layer, and the orthogonal projection of the second sub-via on the base substrate is within an orthogonal projection of the first sub-via on the base substrate.

7. The display substrate according to claim 6, wherein one connection via comprises one first sub-via and a plurality of second sub-vias.

8. The display substrate according to claim 1, wherein the display area comprises a second power line layer, and the fanout area further comprises:
a connection via penetrating the at least two insulation layers, wherein an orthogonal projection of the connection via on the base substrate overlaps an orthogonal projection of the first power line layer on the base substrate; and
a third power line, wherein the third power line and the data line layer are arranged in a same layer and made of a same material, wherein the third power line is connected to the second power line layer, and the third power line is connected to the first power line layer through the connection via.

9. The display substrate according to claim 1, wherein a part of the first power line layer is of a hollow structure.

10. A display device, comprising the display substrate according to claim 1.

11. A method of manufacturing the display substrate according to claim 1, comprising:
successively forming the first power line layer, the at least two insulation layers and the data line layer in the fanout area of the display substrate.

12. The method according to claim 11, wherein the data line layer comprises a plurality of data lines, and the method further comprises:
forming at least two short-circuit connection lines in a detection line area of the display substrate;
forming extension films, wherein each of the extension films extends from a respective one of the at least two insulation layers; and
forming a plurality of data detection lines at a side of the extension films away from the at least two short-circuit connection lines, wherein each of the plurality of data detection lines extends from a respective one of the plurality of data lines,
wherein the plurality of data detection lines comprises at least two data detection line groups, the at least two short-circuit connection lines correspond to the at least two data detection line groups respectively, and each of the at least two short-circuit connection lines is connected to data detection lines in a respective one of the at least two data detection line groups.

13. The method according to claim 12, wherein the forming at least two short-circuit connection lines in the detection line area of the display substrate comprises: forming the first power line layer and the at least two short-circuit connection lines through one patterning process.

14. The method according to claim 11, wherein the display substrate is a top-gate type display substrate; and
the forming the first power line layer comprises: forming the first power line layer and a light shielding metal layer comprised by the top-gate type display substrate through one patterning process.

15. The method according to claim 14, wherein the display substrate further comprises a second power line layer and a third power line,
wherein the forming the at least two insulation layers comprises:
in a direction away from the base substrate, successively forming a buffer layer, a gate insulating layer, and an interlayer dielectric layer; and
forming a connection via penetrating the buffer layer, the gate insulating layer and the interlayer dielectric layer, wherein an orthogonal projection of the connection via on the base substrate overlaps an orthogonal projection of the first power line layer on the base substrate,
wherein the method further comprises:
forming the third power line and the data line layer through one patterning process, wherein the third power line is connected to the second power line layer, and the third power line is connected to the first power line layer through the connection via.

16. The method according to claim 15, wherein the connection via is a stepped via, the stepped via comprises a first sub-via and a second sub-via communicated with the first sub-via, and an aperture size of the first sub-via is greater than an aperture size of the second sub-via, wherein the second sub-via penetrates the buffer layer, and an orthogonal projection of the second sub-via on the base substrate overlaps the orthogonal projection of the first power line layer on the base substrate, wherein the first sub-via penetrates the gate insulating layer and the interlayer dielectric layer, and the orthogonal projection of the second sub-via on the base substrate is within an orthogonal projection of the first sub-via on the base substrate.

17. The method according to claim 16, wherein one connection via comprises one first sub-via and a plurality of second sub-vias.

18. A display substrate, wherein a data line layer comprises a plurality of data lines;
the display substrate further comprises a detection line area at a side of a fanout area away from a display area; and
the detection line area comprises:
a plurality of data detection lines each extending from a respective one of the plurality of data lines, wherein the plurality of data detection lines comprises at least two data detection line groups;
extension films each extending from a respective one of at least two insulation layers; and
at least two short-circuit connection lines arranged at a side of the extension films away from the plurality of data detection lines, wherein the at least two short-circuit connection lines correspond to the at least two data detection line groups respectively, and each of the at least two short-circuit connection lines is connected to data detection lines in a respective one of the at least two data detection line groups.

19. The display substrate according to claim 18, wherein the at least two short-circuit connection lines and a first power line layer are arranged in a same layer and made of a same material.

20. The display substrate according to claim 18, wherein the display substrate is a top-gate type display substrate, and a light shielding metal layer comprised by the top-gate type display substrate and the first power line layer are arranged in a same layer and made of a same material.

* * * * *